(12) United States Patent
Ozkeskin et al.

(10) Patent No.: US 9,627,211 B2
(45) Date of Patent: Apr. 18, 2017

(54) TAPE ASSISTED SINGLE STEP PEEL-OFF ON SIN LAYER ABOVE METAL ELECTRODES

(71) Applicant: Applied Materials, Inc., Santa Clara, CA (US)

(72) Inventors: Fatih Mert Ozkeskin, Union City, CA (US); Jose Manuel Dieguez-Campo, Hanau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 22 days.

(21) Appl. No.: 14/422,607

(22) PCT Filed: Sep. 13, 2013

(86) PCT No.: PCT/US2013/059691
§ 371 (c)(1),
(2) Date: Feb. 19, 2015

(87) PCT Pub. No.: WO2014/046978
PCT Pub. Date: Mar. 27, 2014

(65) Prior Publication Data
US 2015/0214057 A1    Jul. 30, 2015

Related U.S. Application Data

(60) Provisional application No. 61/702,652, filed on Sep. 18, 2012.

(51) Int. Cl.
*H01L 21/268* (2006.01)
*H01L 21/67* (2006.01)
(Continued)

(52) U.S. Cl.
CPC ........ *H01L 21/268* (2013.01); *H01L 21/0217* (2013.01); *H01L 21/321* (2013.01);
(Continued)

(58) Field of Classification Search
CPC ........... H01L 21/31058; H01L 21/3213; H01L 438/765; H01L 21/02255; H01L 21/02252;
(Continued)

(56) References Cited

U.S. PATENT DOCUMENTS 5,559,042 A * 9/1996 Yamazaki ........... H01L 27/0688
257/E27.026
5,932,484 A * 8/1999 Iwanaga ............. H01L 21/3003
257/E21.212
(Continued)

FOREIGN PATENT DOCUMENTS

CN    101118881 A    2/2008
CN    101315909 A    12/2008
(Continued)

OTHER PUBLICATIONS

Chinese Office Action in related application CN 201380048668.7 dated Apr. 29, 2016.
(Continued)

*Primary Examiner* — Julio J Maldonado
*Assistant Examiner* — Stanetta Isaac
(74) *Attorney, Agent, or Firm* — Patterson + Sheridan, LLP (57) ABSTRACT

Methods for processing a substrate are described herein. A method for removing a layer from a substrate, can include positioning a substrate within a processing chamber, wherein the substrate can include an upper surface, and one or more metal features with a separation energy formed on the upper surface; forming a layer over the one or more metal features and the exposed portion of the upper surface; focusing a source of transmissive radiant energy at the layer; pulsing transmissive radiant energy at the upper surface of the substrate creating a separated portion and an attached
(Continued)

portion of the layer; and removing the separated portion of the layer.

20 Claims, 6 Drawing Sheets

(51) Int. Cl.
*H01L 51/00* (2006.01)
*H01L 21/02* (2006.01)
*H01L 21/321* (2006.01)
*H01L 51/52* (2006.01)

(52) U.S. Cl.
CPC .... *H01L 21/67092* (2013.01); *H01L 51/0021* (2013.01); *H01L 51/0023* (2013.01); *H01L 51/5206* (2013.01); *H01L 51/5221* (2013.01)

(58) Field of Classification Search
CPC ............. H01L 21/3105; H01L 438/942; Y10S 438/942; Y10S 438/951; Y10S 438/949; Y10S 438/958; Y10S 438/765
See application file for complete search history.

(56) References Cited

U.S. PATENT DOCUMENTS

| 2006/0211258 | A1* | 9/2006 | Igarashi ................. G11B 5/127 438/759 |
| 2008/0182379 | A1* | 7/2008 | Smith ............... H01L 21/02126 438/400 |
| 2010/0009550 | A1* | 1/2010 | Tsujikawa .......... B23K 26/0604 438/798 |
| 2012/0178198 | A1 | 7/2012 | Raring et al. |
| 2012/0222735 | A1 | 9/2012 | Xu |

FOREIGN PATENT DOCUMENTS

| CN | 102452239 A | 5/2012 |
| KR | 2007-0029421 A | 3/2007 |
| KR | 2012-0040892 A | 4/2012 |
| KR | 2012-0090553 A | 8/2012 |

OTHER PUBLICATIONS

International Search Report and Written Opinion issued in PCT/US2013/059691 on Dec. 26, 2013.

* cited by examiner

TAPE ASSISTED SINGLE STEP PEEL-OFF ON SIN LAYER ABOVE METAL ELECTRODES

BACKGROUND OF THE INVENTION

Field of the Invention

Embodiments of the present invention generally relate to a method of removing film layers from a substrate.

Description of the Related Art

Devices, such as OLEDs, use passivation layers to increase the useful life of the device. Passivation layers can be deposited by chemical vapor deposition (CVD). As the deposition of a film by CVD is generally non-specific, layers of film may form on areas of the substrate where they are not desired, such as the formation of a passivation layer over certain metal features. As such, access to metal layers may be important to the sequential creation of other devices on the same substrate.

During processing, removal of specific areas of film may occur. Techniques for the removal of specific areas of film include masking and etching and laser-based techniques. Masking and etching involves utilization of masks oftentimes made of photoresists. Photoresists are exposed to specific wavelengths of radiation. The exposed portions of the photoresists are removed during a development process to leave portions of the surface to be etched exposed. Pulsed laser sources have been used to perform laser-based material processing for applications such as ablation and delamination of deposited films.

While masking and etching can be used to remove specific surface areas, masking and etching can be cost prohibitive. Laser ablation can be targeted to specific areas of the film to destroy the film in those areas. However, by destroying the layer, laser ablation creates undesirable debris and remnants which must be cleared from the chamber before continuing processing. Related art delamination techniques destroy the layer from under the surface which can create similar debris as standard ablation techniques. Further, specificity of delamination on the substrate may be limited as it is difficult to target specific areas based on the size of the feature.

Thus, there is a need in the art for methods of film removal which are targeted for removal of specific areas of a film while controlling the separation of film.

SUMMARY OF THE INVENTION

Methods for processing a substrate are described herein. A method for removing a layer from a substrate, can include positioning a substrate within a processing chamber, wherein the substrate can include an upper surface, and one or more metal features with a separation energy formed on the upper surface; forming a layer over the one or more metal features and the exposed portion of the upper surface; focusing a source of transmissive radiant energy at the layer; pulsing transmissive radiant energy at the upper surface of the substrate creating a separated portion and an attached portion of the layer; and removing the separated portion of the layer.

The methods described herein generally relate to selectively removing portions of a film from the surface of metal features on a substrate, without disturbing the entire film formed on non-metal surfaces. The embodiments described herein employ transmissive radiant energy which is chosen based on transparency of an upper layer to create a separation between one or more metal features and the upper layer without separating the upper layer from other features or the substrate surface. The separation and removal of the upper layer from the lower layer, referred to hereafter as "lift-off", does not destroy the upper layer, as in ablation, nor does it create cracks and debris from the upper layer, as in delamination.

In one embodiment, a method for removing a layer from a substrate can include positioning a substrate within a processing chamber, wherein the substrate can include an upper surface and one or more metal features with a separation energy formed on the upper surface; forming a layer over the one or more metal features and the exposed portion of the upper surface; focusing a source of transmissive radiant energy at the layer; pulsing transmissive radiant energy at the upper surface of the substrate creating a separated portion and an attached portion of the layer; and removing the separated portion of the layer.

In another embodiment, a method for removing a layer from a substrate, can include positioning a substrate in a processing chamber, wherein the substrate can include a substrate surface with a first separation energy, one or more metal features with a second separation energy, and a passivation layer formed over the metal features; focusing a source of transmissive radiant energy at the substrate; directing transmissive radiant energy toward a portion of the substrate until the second separation energy is reached without reaching the first separation energy creating a separated passivation layer over the metal feature; and removing the separated passivation layer.

In another embodiment, a method for removing a layer from a substrate, can include positioning a substrate in a processing chamber, wherein the substrate can include a substrate surface with a first separation energy, one or more molybdenum features with a second separation energy, and a silicon nitride layer formed over the molybdenum features; positioning a source of transmissive radiant energy to a first position directed at the substrate; pulsing transmissive radiant energy toward a portion of the substrate until the second separation energy is reached without reaching the first separation energy creating a separated silicon nitride layer over the metal feature; moving the source of transmissive radiant energy and sequentially pulsing the transmissive radiant energy creating a field of separated silicon nitride layer over the desired molybdenum features; and removing the separated silicon nitride layer using tape.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The methods described herein generally relate to selectively removing portions of a film from the surface of metal features on a substrate, without disturbing the entire film formed on non-metal surfaces. The embodiments described herein employ transmissive radiant energy which is chosen based on transparency of an upper layer to create a separation between one or more metal features and the upper layer without separating the upper layer from other features or the substrate surface. The separation and removal of the upper layer from the lower layer, referred to hereafter as "lift-off", does not destroy the upper layer, as in ablation, nor does it create cracks and debris from the upper layer, as in delamination.

The lift-off of a layer is believed to yield debris-free and selective removal of layers offering a clean separation between inflated upper layers and lower layers or features, such as metal features. The embodiments described herein are currently envisioned to be applicable to removal of layers deposited both on metal and non-metal features, including but not limited to solar cells, mobile and home displays with dielectric layer thicknesses ranging from 0.5 microns to 3 microns as well as other OLED applications. Embodiments of the present invention are more clearly described with reference to the figures below.

Figure 1:
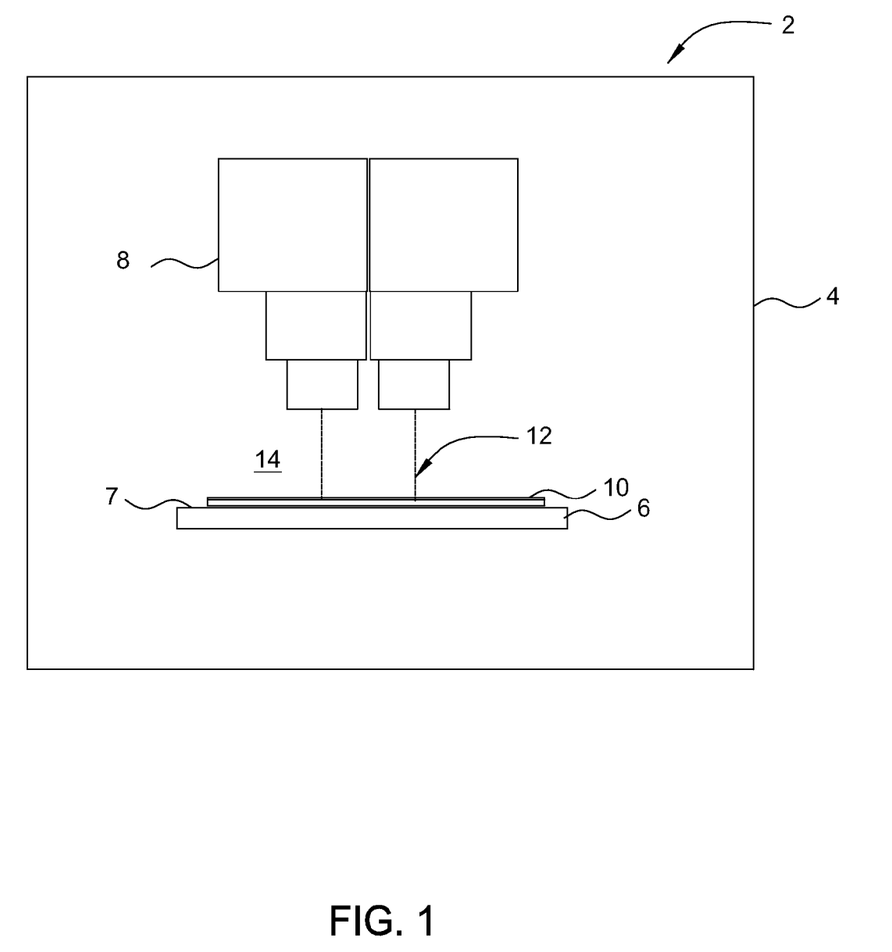
FIG. 1 is a depiction of a radiant energy processing chamber according to one embodiment.

FIG. 1 illustrates a radiant energy processing chamber 2 applicable to embodiments of the present invention. The radiant energy processing chamber 2 can have a plurality of chamber walls 4 which enclose the processing volume. A substrate support 6 can be positioned within the radiant energy processing chamber 2. A substrate 10 can be positioned on the substrate support 6. The radiant energy processing chamber 2 can have one or more sources of radiant energy 8.

The sources of radiant energy 8 can produce radiant energy 12 which is directed at the surface of the substrate 10. The sources of radiant energy 8 can be a coherent energy source, such as a laser. Though FIG. 1 is depicted with only two sources of radiant energy 8, embodiments can include one or more sources of radiant energy 8. The sources of radiant energy 8 can move or pulse in unison or independently. Further embodiments can include an array of sources of radiant energy 8 which can move and pulse in unison or independently. As well, any combination of the above embodiments may be used. Each source of radiant energy 8 can consist of a single source or a plurality of sources which can be focused on one or more points on the surface of the substrate 10. The sources of radiant energy 8 can be directed toward the substrate support 6. As well, the sources of radiant energy 8 can increase or decrease power delivered to a point on the substrate 10 at a specified wavelength in addition to controlling the amount of time processing a specific point on the substrate 10.

The substrate support 6 can have a substrate supporting surface 7 facing the sources of radiant energy 8. The substrate 10 can be in connection with the substrate supporting surface 7. Further, the substrate support 6 can be either mobile or stationary, based on the design of both the radiant energy processing chamber 2 and one or more sources of radiant energy 8. The substrate support 6 and the plurality of chamber walls 4 can define a processing space 14 in the chamber. The substrate support 6 can comprise aluminum.

Figure 2A:
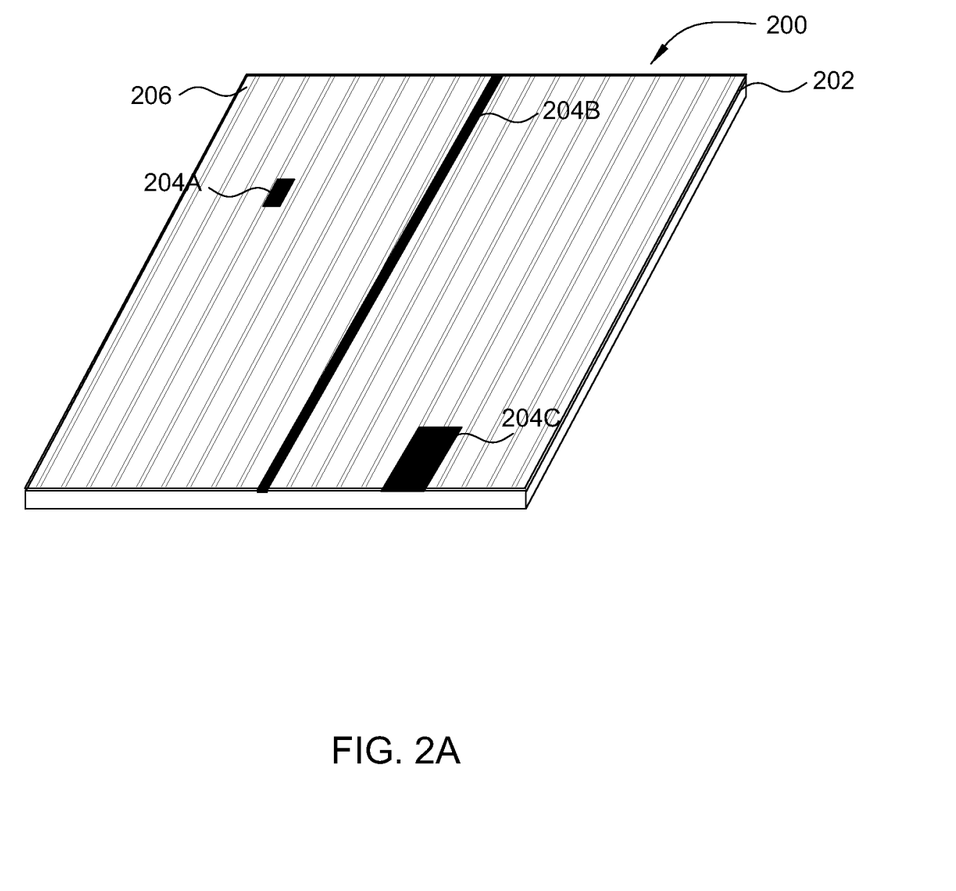
FIGS. 2A-2D illustrate a substrate with metal features and an upper layer processed according to one embodiment.

FIG. 2A illustrates a side view of a substrate 200 with one or more metal features according to one embodiment. The substrate 200 can be of any available composition, such as a quartz, glass, or sapphire substrate. Standard substrate sizes can be used with embodiments of the present invention. Embodiments described herein can be scaled such that larger or smaller substrates can be processed without diverging from the embodiments described or claimed herein.

The substrate 200 has a substrate surface 202. The substrate surface 202 may be a substantially flat surface with one or more features formed thereon. Deposited on the substrate 200 may also be one or more metal features 204A-204C. The metal features 204A-204C can be of any shape or size. Further the metal features 204A-204C can be composed of any metal or metal composites, such as a molybdenum (Mo) feature. The metal features 204A-204C may be of varying thicknesses and varying widths, as the needs of the device and the user demand. The upper surface of the one or more metal features 204A-204C can share the same plane as the surrounding substrate surface 202.

An upper layer 206 is then formed over the substrate surface 202 including the metal features 204A-204C. The upper layer 206 can be a conformal layer, such as a layer deposited by a CVD process or a PVD process. The upper layer 206 may be a passivation layer, such as a layer comprising silicon nitride (SiN). Further the upper layer 206 may be transparent to one or more wavelengths of radiant energy, such as a layer which is transparent to wavelengths of radiant energy between 490 nm and 550 nm, for example 510 nm. Further, the upper layer 206 can be of a thickness which allows for proper separation from an underlying feature while preventing cracking during the separation, with embodiments between 0.5 microns and 5 microns, and preferred embodiments between 0.5 microns and 3 microns, for example 1.5 microns.

Figure 2B:
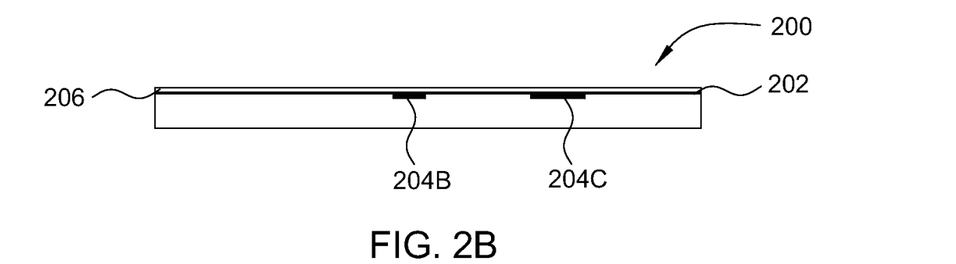

FIG. 2B is a cross-sectional view of a substrate 200 prior to processing with radiant energy. The upper layer 206 is deposited over the substrate surface 202 and the metal features 204B and 204C. The one or more sources of radiant energy (shown in FIG. 1) can be directed at one or more of the metal feature 204B and 204C or they can be directed at a field which includes one or more of the metal features 204B and 204C. It is not required that the features be directly targeted by the source of radiant energy. Further, it is not required that all metal features be processed. The radiant energy then targets either the field or the metal feature providing energy at the separation energy of the upper layer 206 and the one or more metal features 204B and 204C.

Figure 2C:
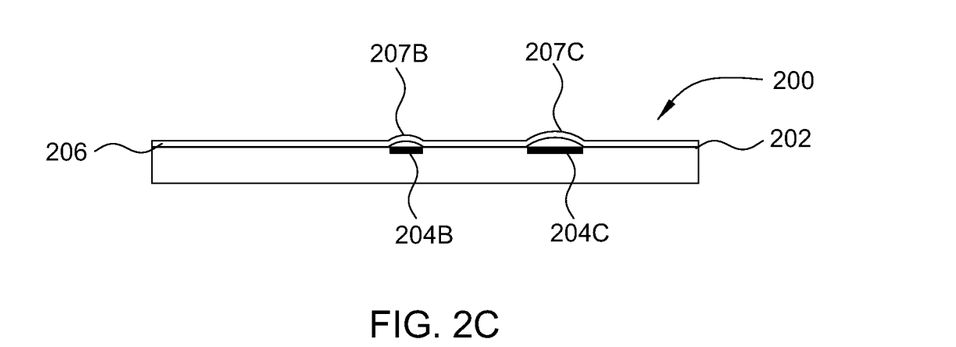

FIG. 2C is a cross-sectional view of a substrate 200 after processing with the radiant energy. Once the separation energy of the combination of materials is reached, the upper layer 206 separates from the one or more metal features 204B and 204C, as shown by one or more separated upper layers 207B and 207C. If one or more of the metal features 204B and 204C are not processed with radiant energy, the upper layer 206 will not be separated from the unprocessed metal feature 204B and 204C. Note that even if you process a field that includes one or more metal features 204B and 204C, the separation energy of surrounding areas are not reached. This creates selective separation of targeted features, such as the metal features 204B and 204C, without separating nearby areas.

Separated upper layers 207B and 207C can then be easily removed using an adhesive connector, such as Kapton tape. The adhesive connector (not shown) can be positioned over the upper layer 206, including the separated upper layers 207B and 207C. After the adhesive connector contacts and adheres to the surface of the upper layer 206 and the separated upper layers 207B and 207C, the adhesive connector can be mechanically removed. The separated upper layers 207B and 207C are attached to the adhesive connector with either no attachment or limited attachment to the metal feature 204B and 204C below. Therefore, the mechanical removal of the adhesive connector will also remove the one or more separated upper layers 207B and 207C.

Figure 2D:
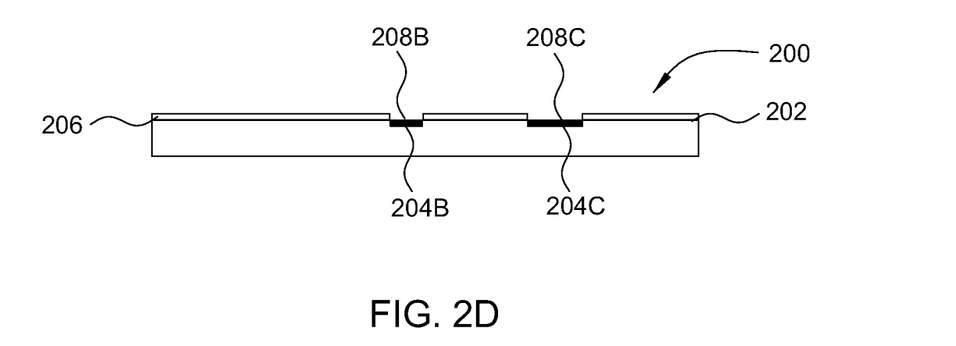

FIG. 2D is a cross-sectional view of a substrate 200 which has lifted off portions of the upper layer 206. After the separated upper layers 207B and 207C are lifted from the substrate, one or more metal feature surfaces 208B and 208C are exposed. The metal feature surfaces 208B and 208C are free from debris due to the lift off process and are also free from contaminants due to the upper layer. As the separation energy of the metal features 204B and 204C were reached without reaching the separation energy of the nearby substrate surface 202 or other features which may be deposited thereon, the only exposed areas will be metal feature surfaces 208B and 208C. All other surfaces will remain covered by the upper layer 206 with a clear separation line between the exposed areas of the metal feature surface 208B and 208C and the covered areas of the substrate surface 202.

Figure 3:
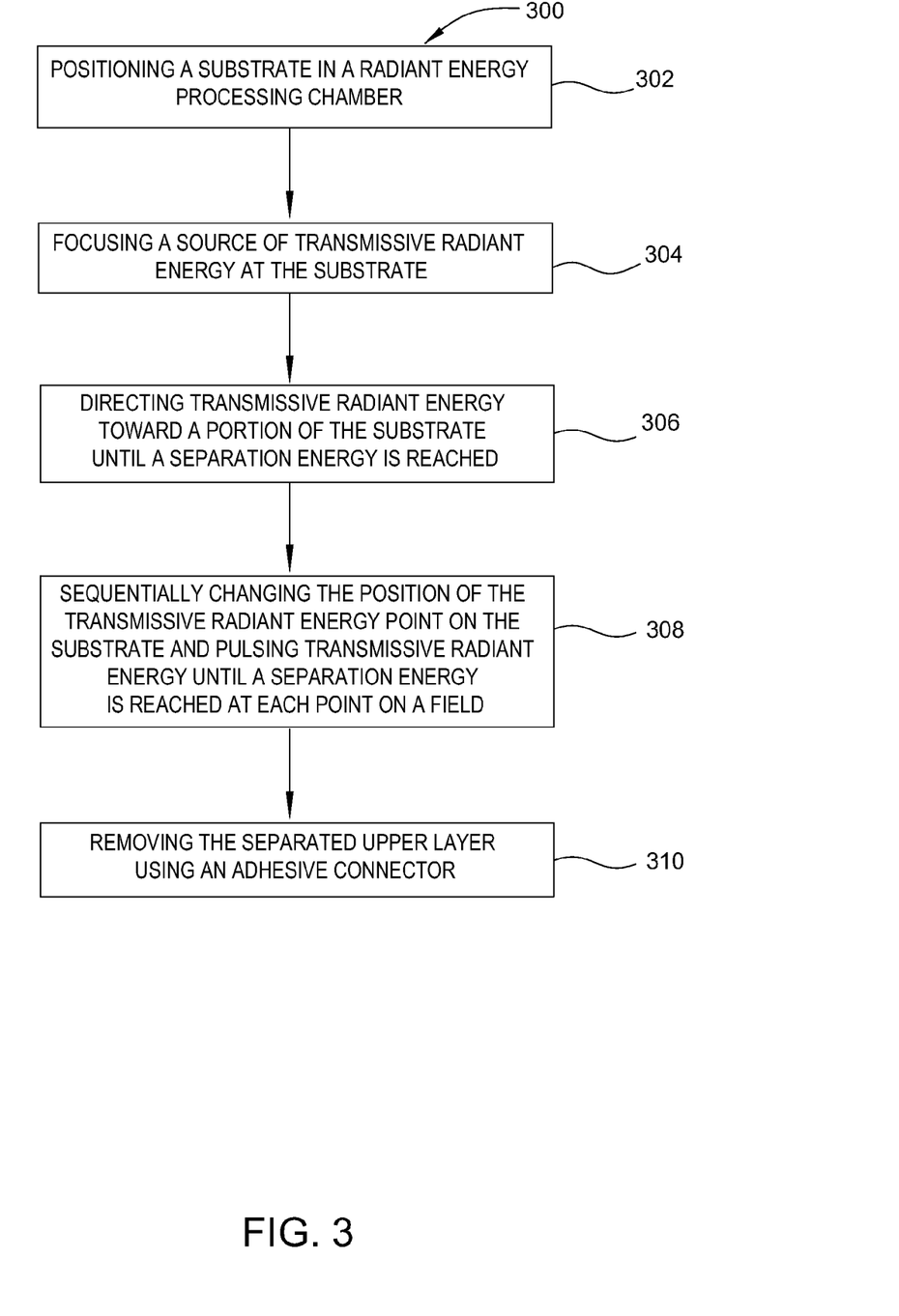
FIG. 3 is a block diagram of the method according to one embodiment.

FIG. 3 is a block diagram of the method according to one embodiment. The method 300 can include positioning a substrate in a radiant energy processing chamber, as in step 302. The substrate can be a substrate as described in FIG. 2, including metal features and/or non-metal features formed on a substrate surface with an upper layer formed over the substrate surface and the features.

The processing chamber used with embodiments of the present invention can be any processing chamber known in the art which is capable of focusing a source of radiant energy at a substrate, such as a processing chamber which follows the general design described in FIG. 1. Suitable processing chambers are available from Applied Materials, Inc., Santa Clara, Calif., but chambers sold by other manufacturers may be adapted to perform the methods discussed herein.

The method 300 can further include focusing a source of radiant energy at the substrate, as in step 304. The source of radiant energy should produce radiant energy which the upper layer is transparent to. This allows radiant energy to be transmitted to the surface below the upper layer without directly affecting the upper layer. The source of radiant energy can be any source which can produce a coherent radiant energy, such as a laser. Further the source of radiant energy should produce a coherent beam of a specific wavelength so that the beam will be transparent with reference to the upper layer but not to the metal feature, such as a coherent beam of radiant energy for use with a SiN upper layer of a wavelength between 490 nm and 550 nm, for example 510 nm.

The source of radiant energy can be designed to target only the areas which have a feature formed thereon or therein. In a further embodiment, the source can be designed to target a field of the substrate which includes a feature thereby focusing radiant energy both on metal features and surrounding areas. The source can be focused at the surface either at an angle or perpendicular to the surface of the substrate. The source can also be mobile, such that the source can move along the surface of the substrate or the source can be a stationary source with the substrate moving to reposition the area to be processed.

The method 300 can further include directing transmissive radiant energy toward a portion of the substrate until a separation energy is reached, as in step 306. Transmissive radiant energy is a coherent radiation which can be transmitted through the upper layer to the lower layer. The separation energy of a surface is the power of a radiant energy source delivered over a period of time which is required for separation between the upper layer and the lower surface, such as that of a metal feature formed on the substrate surface. The separation energy of a surface is controlled by a number of factors such as composition of the lower surface, thickness of the upper layer, composition of the upper layer and the opacity of the upper layer to the wavelength of radiant energy used. The separation energy is higher for thicker upper layers. Composition of either the lower surface or the upper layer will cause the separation energy to vary. In one example, a lower surface composed of aluminum with a 1.5 micron thick SiN upper layer was determined to have a separation energy in the range of from 0.1 J/cm$^2$ to 0.7 J/cm$^2$, such as approximately 0.3 J/cm$^2$. In another example, a lower surface composed of molybdenum with a 1.5 micron thick SiN upper layer was determined to have a separation energy in the range of from 0.05 J/cm$^2$ to 0.5 J/cm$^2$, such as approximately 0.11 J/cm$^2$. The examples described above are but two permutations of numerous embodiments and are not meant to be limiting of the possible embodiments described herein.

Without intending to be bound by theory, it is believed that the radiant energy is delivered to the lower surface, such as a metal feature, through the upper layer. The radiant energy is at least partially absorbed by the lower surface which can heat the lower surface directly and heat the bottom surface of the upper layer indirectly. As the lower surface is heated to a higher degree than the bottom surface of the upper layer, the lower surface can undergo a structural alteration/change and the upper layer can expand due to localized heating. Thus, it is believed that the structural alteration/change in the lower surface can allow expanding of the upper surface and subsequent detachment, creating the separated upper layer. It is further believed that the upper surface, such as SiN described above, should be under compressive stress to allow for proper separation after the laser processing.

The method 300 can further include sequentially changing the position of the transmissive radiant energy point on the substrate and pulsing transmissive radiant energy until a separation energy is reached at each point in a field, as in step 308. Changing the position of the transmissive radiant energy point is meant to include both moving the source of radiant energy, moving the substrate, moving the substrate support or any combination thereof. Further, such movement or rearrangement may occur sequentially or in unison. The properties of the transmissive radiant energy point, such as width, may be altered to meet the needs of the substrate, such as flowing radiant energy through an aperture so as to create a square shaped point on the surface of the substrate. Each point on the substrate surface has a separation energy which correlates to composition of the two layers and thickness of the two layers. As such, the transmissive radiant energy must be focused at each point on a field or over a feature based on the width of the transmissive radiant energy.

Further, the pulsing of transmissive radiant energy should have some lateral overlap to assure complete coverage of the field or the specific metal feature/features being targeted.

The lateral overlap should be controlled so as to not over-process certain areas, which can create separation in areas where separation is not desired or cracking/ablation in areas where separation is desired. The requirements of lateral overlap for effective processing will be affected by the properties of the transmissive radiant energy. For example, a non-homogenized radiant energy will require more lateral overlap due to non-uniform energy over the width of the beam. This is due to the edges of a non-homogenized beam having lower energy than the center. Embodiments described in the present application can use a lateral overlap of between 5% and 50% based on homogeneity of the radiant energy, the width of the radiant energy as delivered to the surface and OPC techniques used for edge control of the radiant energy.

Separation energy is the energy delivered over a period of time which is required for separation of an upper surface from a lower surface in a stacked layer structure. The separation energy is a property of the combination of the upper and lower surfaces, and the stresses in the separating layers, based on the thickness and composition of the surfaces.

As noted earlier, separation energy is controlled by a number of factors including composition of the underlying surface. As such, a field may be pulsed by a transmissive radiant energy such that the separation energy of the metal feature is reached and the separation energy of the nearby substrate surface is not. In this way, specific features may be targeted for separation from the upper layer based on composition without having to target only the processing area with the radiant energy.

It is important to note that the separation energy is a determination of the energy required to separate one surface from another and is measured in power delivered over a period of time. As such, when considering the separation energy of a material with an upper layer, the power and the scan rate of the radiant energy can be varied, so long as the separation energy is met.

Though embodiments herein are described with reference to metal features, it is envisioned that the separation described here can be accomplished using features with different compositions, so long as the feature has a first separation energy and the surrounding areas have a second separation energy which is different from the first separation energy. In the embodiments described here, a portion of the field can be processed with radiant energy to reach the first separation energy without reaching the second separation energy.

The method 300 can further include removing the separated upper layer using an adhesive connector, as in step 310. The areas which were previously separated should remain in one piece and represent the shape of the underlying metal feature. The upper layer above the metal feature can then be lifted off using an adhesive connector.

An adhesive connector is a device which can make an adhesive contact with the surface of the substrate and gently remove the separated portion of the upper layer without damaging the non-separated portion. Examples of an adhesive connector can include Kapton tape. The adhesive connector can be placed in contact with the surface so as to remove separated portions while maintaining the separated portions as a single piece with respect to the size and shape of the underlying metal feature. By removing the separated portions of the upper layer using an adhesive connector, particle formation can be avoided during lift-off.

Adhesive connectors used with embodiments of this application have a gentle adhesive. As the thickness of the upper layer is generally between 0.5 µm and 5.0 µm, and preferably between 0.5 µm and 3.0 µm, the substrate may be damaged by a strong adhesive. The adhesive connector may be used on relatively small areas, such as from 2 mm to 5 mm, with preferred embodiments of from 2 mm to 4 mm and more preferred embodiments of from 3 mm to 4 mm. Adhesive strength requirements and needs can be amended for application to layers with a higher lateral strength.

Expanded areas of the upper layer which are separated from the lower layer are positioned on the adhesive connector. The adhesive connector is removed using mechanical force, such as that delivered by a person, a robot or some other device. As the layer is separated, the film will be positioned on the adhesive connector so as to reflect the position of the areas which are exposed on the surface of the substrate.

Figure 4A:
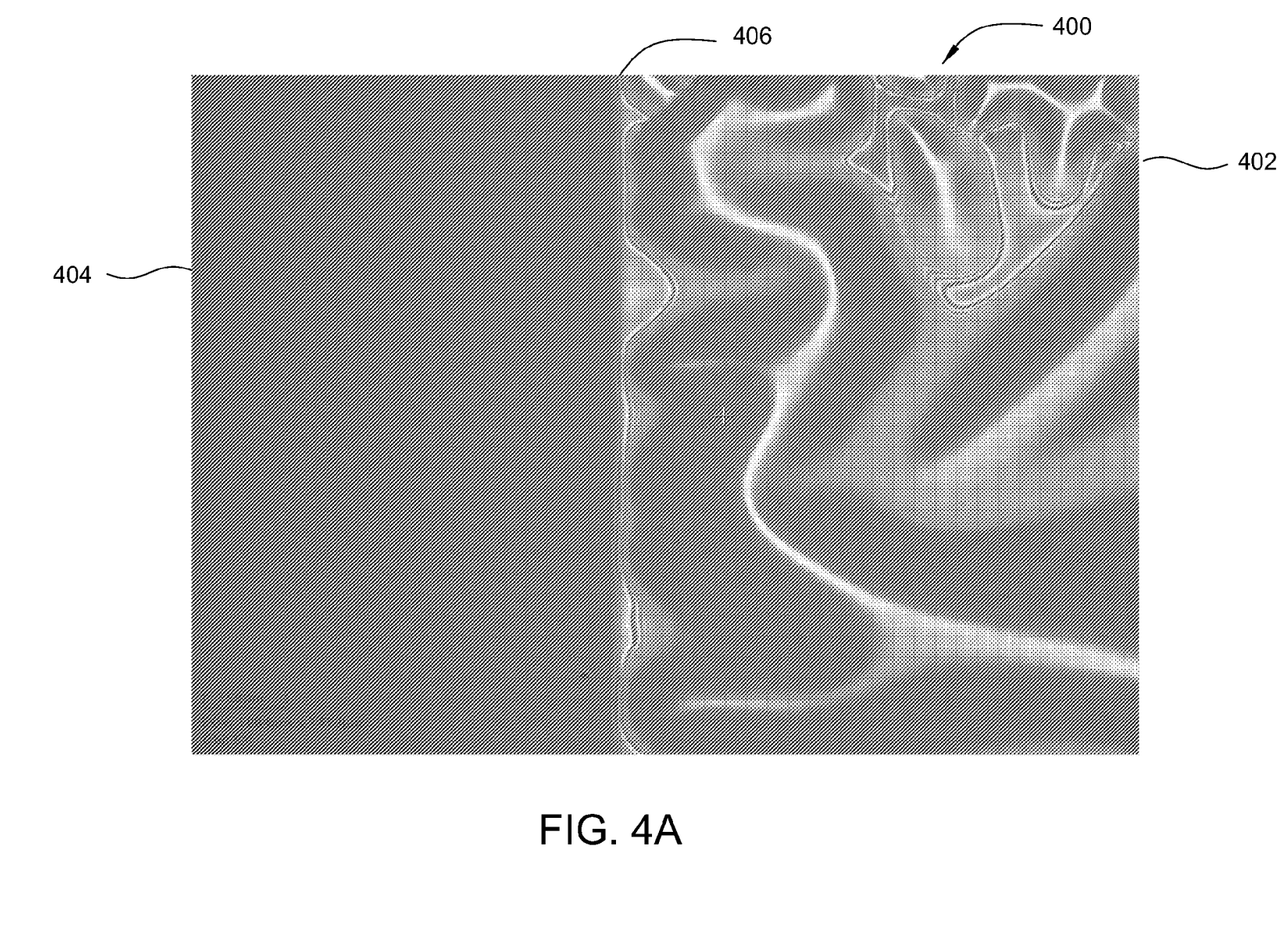
FIGS. 4A and 4B illustrate an exemplary embodiment of a substrate which has been treated to remove a portion of the layer deposited over a metal feature.

FIG. 4A illustrates an exemplary embodiment of a substrate 400 which has been treated to remove a portion of the layer deposited over a metal feature using methods described above. A 150 mm silicon substrate with an upper layer of 1.5 µm SiN with a variance of 10% is formed over a 300 nm Mo layer was positioned in a radiant energy processing chamber. The frame of view visible in the depiction is 1884 microns by 1413 microns. The surface of the substrate was processed using a green laser (approximately 532 nm) at 1.05 W of power, with a 200 kHz repetition rate and a scan rate of 6-13 m/s. The lateral beam overlap for area inflation for this embodiment was between 30 µm and 70 µm.

A portion of the surface of the substrate was processed creating an inflated upper SiN surface 402, which is an area of the SiN upper surface which was separated from the underlying Mo surface, without lifting the SiN upper surface from the non-processed areas, as shown by the untreated SiN surface 404. Notable from the embodiment shown here is that there are no exposed areas of the processed Mo surface, either by cracks, as would be expected from laser delamination, or by destruction of the surface, as would be expected by laser ablation. Further, there is a clear line of separation 406 between the inflated upper SiN surface 402 and the untreated SiN surface 404. After processing, the separated portion of the SiN upper layer was removed using Kapton tape (not shown here).

Figure 4B:
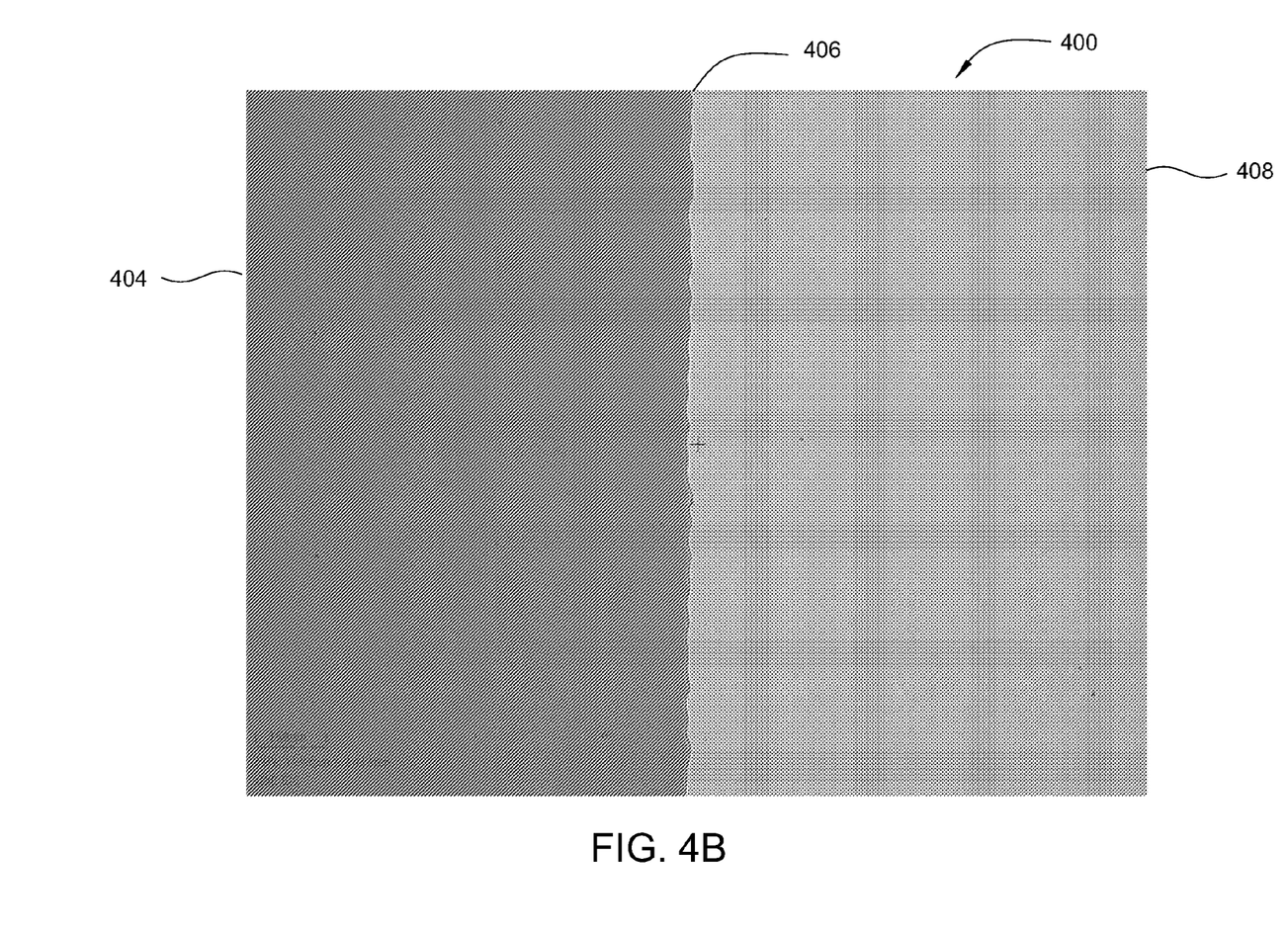

FIG. 4B shows a comparative cross-section between the lifted off surface and the unprocessed surface of the substrate. The line of separation 406 in the center of the substrate separates an exposed Mo layer 408 from the untreated SiN surface 404. As is visible from the substrate surface, the exposed Mo layer 408 is completely clean, with no remaining residue from the inflated upper SiN surface 402 from FIG. 4A after lift-off using the Kapton tape. The line of separation 406 is substantially straight and indicates the boundary of the processing step performed previously.

Without intending to be bound by theory, it is believed that the radiant energy leads to expansion at the surface of the metal feature while not directly heating the upper layer. As such, by heating the metal feature using a source of radiant energy which passes through the upper layer, the metal can expand and relax without affecting other nearby features or surfaces. Further, as the surface heats, the layer above will receive radiant heating from the surface, rather than direct heating from the laser. This processing at a predetermined separation energy will create both distinct thermal and expansion differences between the upper layer and the metal feature below. Thus, the heating and subsequent expansion of the metal feature at differing rates than that of the upper layer can lead to distortion of the surface binding between the dissimilar layers.

Embodiments described herein relate to methods of removing select areas of an upper layer. It is important to be able to access metal features or layers that are deposited on a substrate which are disposed under layers formed over the surface of the substrate, for continued processing of the substrate. Standard etching techniques to access the metal features are either costly, create debris, lack precision or some combination thereof. By controlling the timing and energy level of radiant energy to reach the separation energy of the metal feature without absorbance or with limited absorbance of the radiant energy by the upper layer, a separated layer can be formed. Through the use of an adhesive connector, the separated layer can be removed in one piece. This method can prevent the formation of debris while targeting specific areas and limiting cost of processing.

While the foregoing is directed to embodiments of the present invention, other and further embodiments of the invention may be devised without departing from the basic scope thereof, and the scope thereof is determined by the claims that follow.

The invention claimed is:

1. A method for removing a layer from a substrate, comprising:
   positioning a substrate within a radiant energy processing chamber, the substrate comprising:
      exposed portions of an upper surface of the substrate; and
      one or more metal features formed on the upper surface between the exposed portions, wherein the one or more metal features have a separation energy;
   forming a passivation layer over the one or more metal features and the exposed portions of the upper surface;
   focusing a source of transmissive radiant energy at a field including the one or more metal features, wherein the passivation layer is transparent to one or more wavelengths of the transmissive radiant;
   pulsing transmissive radiant energy at the upper surface of the substrate until the separation energy is reached and at least a portion of the passivation layer is separated from the one or more metal features; and
   removing the separated portion of the passivation layer.

2. The method of claim 1, wherein the passivation layer comprises silicon nitride.

3. The method of claim 2, further comprising moving the source of transmissive radiant energy in a stepwise fashion to direct transmissive radiant energy over the field.

4. The method of claim 3, wherein the pulses of transmissive radiant energy overlap laterally.

5. The method of claim 1, wherein the one or more metal features comprises molybdenum.

6. The method of claim 1, wherein the transmissive radiant energy has a power level and a scan rate providing the separation energy for the metal features.

7. The method of claim 1, wherein the separated portion of the passivation layer is removed using an adhesive connector.

8. The method of claim 1, wherein the transmissive radiant energy is a laser.

9. The method of claim 1, wherein the transmissive radiant energy is at least partially absorbed by the metal features.

10. A method for removing a layer from a substrate, comprising:
    positioning a substrate in a processing chamber, wherein the substrate comprises:
       a substrate surface having a first separation energy;
       one or more metal features having a second separation energy; and
       a passivation layer disposed over the one or more metal features and the substrate surface;
    focusing a source of transmissive radiant energy at the substrate;
    delivering transmissive radiant energy to a portion of the substrate until the second separation energy is reached without reaching the first separation energy so that a portion of the passivation layer is separated from the one or more metal features, wherein the portion of the passivation layer is transparent to one or more wavelengths of the transmissive radiant energy; and
    removing the separated portion of the passivation layer.

11. The method of claim 10, wherein the transmissive radiant energy is at least partially absorbed by the metal feature.

12. The method of claim 10, further comprising moving the source of transmissive radiant energy in a stepwise fashion to direct transmissive radiant energy over a field having the one or more metal features.

13. The method of claim 12, wherein the pulses of transmissive radiant energy overlap laterally.

14. The method of claim 12, wherein the one or more metal features comprise molybdenum.

15. The method of claim 10, wherein the one or more metal feature comprises molybdenum.

16. The method of claim 10, wherein the transmissive radiant energy has a power level and a scan rate providing the second separation energy for the metal features.

17. The method of claim 10, wherein the separated portion of the passivation layer is removed using an adhesive connector.

18. The method of claim 10, wherein the transmissive radiant energy is a laser.

19. A method for removing a layer from a substrate, comprising:
    positioning a substrate in a processing chamber, the substrate having:
       a substrate surface having a first separation energy;
       one or more molybdenum features having a second separation energy, wherein the one or more molybdenum are formed in the substrate surface; and
       a silicon nitride layer formed over the molybdenum features;
    directing a source of transmissive radiant energy at a portion of the substrate;
    pulsing transmissive radiant energy toward the portion of the substrate until the second separation energy is reached without reaching the first separation energy so that a first portion of the silicon nitride layer is separated from the one or more molybdenum features;
    moving the source of transmissive radiant energy or the substrate and sequentially pulsing the transmissive radiant energy so that a second portion of the silicon nitride layer is separated from the one or more molybdenum features; and
    removing the separated silicon nitride layer using tape.

20. The method of claim 19, wherein the transmissive radiant energy is at least partially absorbed by the metal features.

* * * * *